(12) United States Patent
Hsu et al.

(10) Patent No.: US 9,048,089 B2
(45) Date of Patent: Jun. 2, 2015

(54) APPARATUS TO IMPROVE INTERNAL WAFER TEMPERATURE PROFILE

(71) Applicant: Taiwan Semiconductor Manufacturing Co., Ltd., Hsin-Chu (TW)

(72) Inventors: Yu-Yen Hsu, Zhudong Township (TW); Shao-Yen Ku, Jhubei (TW); Chun-Li Chou, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 198 days.

(21) Appl. No.: 13/762,500

(22) Filed: Feb. 8, 2013

(65) Prior Publication Data

US 2014/0224785 A1  Aug. 14, 2014

(51) Int. Cl.
| F27D 11/00 | (2006.01) |
| H01L 21/02 | (2006.01) |
| H05B 1/02  | (2006.01) |
| B08B 3/00  | (2006.01) |

(52) U.S. Cl.
CPC ........ *H01L 21/02076* (2013.01); *H05B 1/0233* (2013.01)

(58) Field of Classification Search
CPC ................. H01L 21/020706; H01L 21/02087; H01L 21/0209; H01B 1/00
USPC .......................................... 219/438; 134/105
See application file for complete search history.

(56) References Cited

U.S. PATENT DOCUMENTS 8,828,183 B2 *   9/2014   Namba et al. ............ 156/345.21
2012/0183909 A1 *   7/2012   Inatomi et al. ................. 430/435

* cited by examiner

*Primary Examiner* — Shawntina Fuqua
(74) *Attorney, Agent, or Firm* — Eschweiler & Associates, LLC

(57) ABSTRACT

Some embodiments relate to methods and apparatus for providing a homogeneous wafer temperature profile in a wafer cleaning tool without introducing unwanted particles onto the wafer. In some embodiments, a disclosed wafer cleaning tool has a processing chamber configured to house a semiconductor wafer. A dispensing arm provides a high temperature cleaning solution to the semiconductor wafer. A heating cup is located within the processing chamber at a position that is around the perimeter of the semiconductor wafer. The heating cup generates heat that increases the temperature of outer edges of the semiconductor wafer by a greater amount than a temperature of a center of the semiconductor wafer, thereby homogenizing an internal temperature profile of the semiconductor wafer.

20 Claims, 4 Drawing Sheets

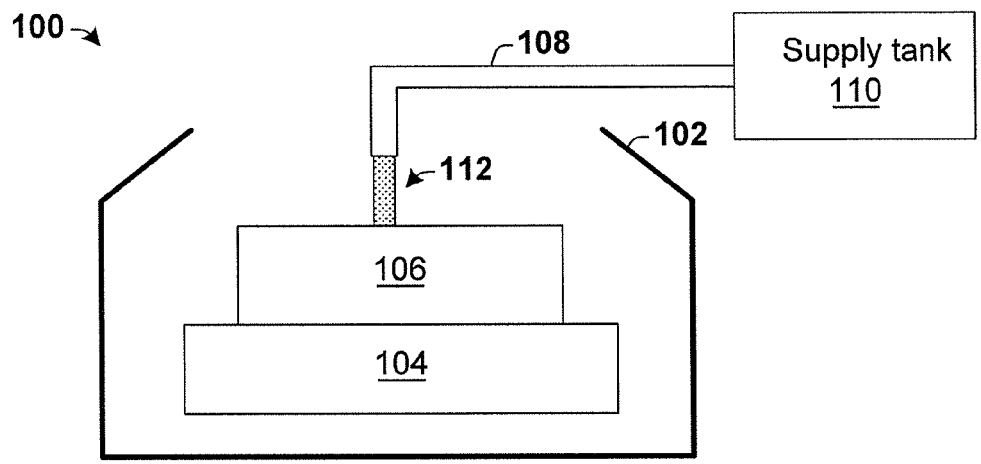
Fig. 1A
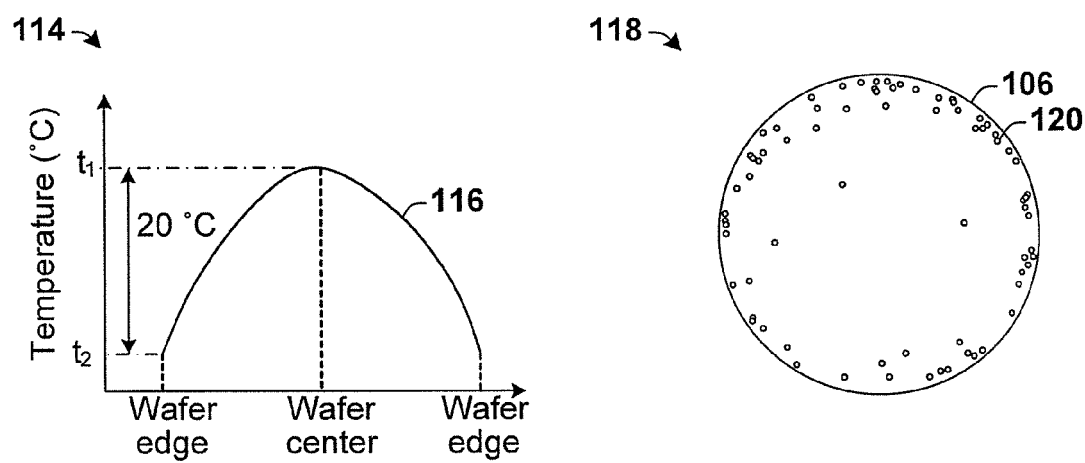
Fig. 1B
Fig. 1C

APPARATUS TO IMPROVE INTERNAL WAFER TEMPERATURE PROFILE

BACKGROUND

Semiconductor wafer cleaning is widely used in semiconductor processing. For example, many processes used for integrated chip fabrication (e.g., deposition processes, etching processes, etc.) leave a residue on a semiconductor wafer. If the residue is not removed, it can contaminate devices on the semiconductor wafer leading to failure of integrated chips on the semiconductor wafer.

In recent technology nodes (e.g., 28 nm, 22 nm, etc.), the semiconductor industry has increasingly replaced large batch (i.e., wet bench) cleaning systems with single wafer cleaning tools for removal of contaminant particles from a wafer surface. Single wafer cleaning tools are configured to perform a wet clean process of a single semiconductor wafer at a given time. Using a single wafer cleaning tool allows for better process control in wet cleaning solutions, thereby improving particle removal efficiency (PRE) and increasing yield.

BRIEF DESCRIPTION OF THE DRAWINGS

FIGS. 1A-1C describe a single wafer cleaning tool configured to perform a wet cleaning process.

DETAILED DESCRIPTION

Figure 2A:
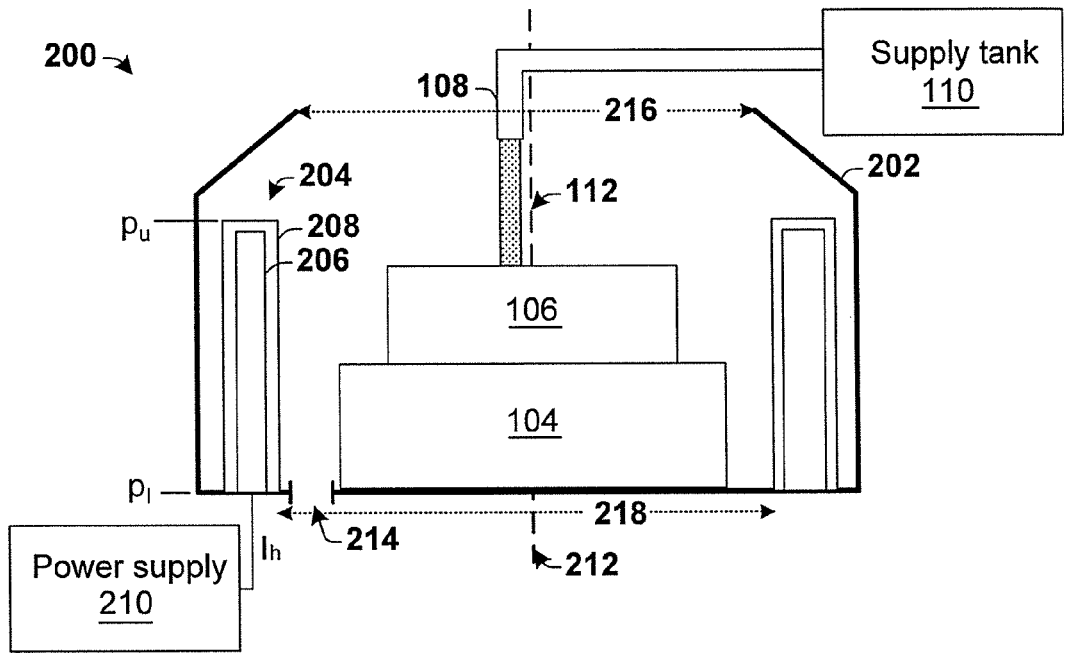
FIG. 2A illustrates a block diagram showing a cross-sectional view of a disclosed single wafer cleaning tool having a heating cup.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

FIG. 1A illustrates a single wafer cleaning tool 100 configured to perform a wet cleaning process. The single wafer cleaning tool 100 comprises a processing chamber 102 having a wafer chuck 104 configured to hold a semiconductor wafer 106. A dispensing arm 108 extends from a supply tank 110 to a position over an opening in the top of the processing chamber 102. The dispensing arm 108 is configured to dispense a high temperature cleaning solution 112 onto the semiconductor wafer 106. The high temperature cleaning solution 112 is configured to remove residue (e.g., organic contaminants, metal contaminants, photoresist residue, etc.) from the semiconductor wafer 106.

The high temperature of a high temperature cleaning solution improves the particle removal efficiency (PRE) of the single wafer cleaning tool 100 in comparison to non-high temperature cleaning solutions. However, the high temperature cleaning solution 112 heats the semiconductor wafer 106 unevenly since it transfers more heat to where the solution initially contacts the semiconductor wafer 106. For example, FIG. 1B is a graph 114 showing a trend line 116 illustrating an internal temperature profile of a semiconductor wafer (e.g., semiconductor wafer 106) comprised within a high temperature cleaning tool that provides a high temperature cleaning solution to a center of the wafer. The trend line 116 shows a temperature gradient over the semiconductor wafer that causes edges of the semiconductor wafer to have a lower temperature than a center of the semiconductor wafer. For example, as shown in graph 114, the temperature at outer edges of the semiconductor wafer are approximately 20° C. degrees lower than the temperature at a center of the semiconductor wafer.

The large temperature difference over the semiconductor wafer leads to different particle removal efficiencies, surface defects, residue, etc. For example, FIG. 1C illustrates a top-view 118 of a semiconductor wafer 106 cleaned with a conventional single wafer cleaning tool. As shown in top-view 118, the outer edges of the semiconductor wafer 106, which have a lower internal temperature during cleaning, have a greater number of surface defects 120.

Accordingly, the present disclosure relates to methods and apparatus for providing a homogeneous internal temperature profile for a semiconductor wafer in a wafer cleaning tool without introducing unwanted particles onto the wafer. In some embodiments, a disclosed wafer cleaning tool comprises a processing chamber configured to house a semiconductor wafer. A dispensing arm is configured to provide a high temperature cleaning solution to a central region of the semiconductor wafer. A heating cup is located within the processing chamber at a position that is around the perimeter of the semiconductor wafer. The heating cup is configured to generate heat (e.g., thermal radiation) that increases the temperature of outer edges of the semiconductor wafer by a greater amount than a temperature of a center of the semiconductor wafer, thereby homogenizing an internal temperature profile of the semiconductor wafer.

FIG. 2A illustrates some embodiments of a disclosed single wafer cleaning tool 200 having a heating cup 204.

The single wafer cleaning tool 200 comprises a processing chamber having a cup-shaped housing 202. In some embodiments, the cup shaped housing 202 may comprise a cylindrical housing having an opening at a top of the cylindrical housing. The cup-shaped housing 202 comprises a wafer chuck 104 configured to hold a semiconductor wafer 106. In some embodiments, the wafer chuck 104 may comprise a spin chuck configured to rotate at a high rate of rotation around an axis of rotation to dry the semiconductor wafer 106 by using a centrifugal force that removes cleaning solution effluent from the semiconductor wafer 106 to an exhaust outlet 214.

A dispensing arm 108 extends from a supply tank 110 to a position over an opening in a top-side of the cup-shaped housing 202. The dispensing arm 108 is configured to provide a high temperature cleaning solution 112 to the semiconductor wafer 106. In some embodiments, the high temperature cleaning solution 112 has a temperature of greater than or equal to approximately 60° C. In some embodiments, the supply tank 110 may comprise a heating element configured to increase the temperature of the high temperature cleaning solution 112 prior to providing it to the dispensing arm 108.

A heating cup 204 is located inside of the cup-shaped housing 202. The heating cup 204 is positioned around the periphery of the semiconductor wafer 106. The heating cup 204 extends from an upper position $p_u$ above the semiconductor wafer 106 to a lower position $p_l$ below the semiconductor wafer 106. In various embodiments, the positions of the upper and lower positions, $p_u$ and $p_u$, may vary. The heating cup 204 has an opening 216 at a top of the cup-shaped housing 202. In some embodiments, opening 216 prevents the heating cup from extending to a position over the semiconductor wafer 106. In some embodiment, the heating cup 204 further comprises an opening 218 at a bottom of the cup-shaped housing 202. In some embodiments, opening 218 prevents prevent the heating cup 204 from extending to a position below the semiconductor wafer 106. In some embodiments, the heating cup 204 and the cup shaped housing 202 are concentric with one another around a common axis 212.

The heating cup 204 is configured to generate heat (e.g., thermal radiation), which raises the temperature of the semiconductor wafer 106. The heat generated by the heating cup 204 raises the internal temperature of the semiconductor wafer 106 by an amount that is inversely proportional to a distance from the common axis 212. Therefore, positioning the heating cup 204 around the periphery of the semiconductor wafer 106 increases the temperature at outer edges of the semiconductor wafer 106 by a larger amount than at a center of the semiconductor wafer 106, causing low temperature edges of the semiconductor wafer 106 to be heated in a manner that increases a homogeneity of an internal temperature across the semiconductor wafer 106.

Placement of the heating cup 204 at a location around the periphery of the semiconductor wafer 106 provides for a number of advantages over placement of a heating element above and/or below the semiconductor wafer 106. For example, to heat outer edges of a semiconductor wafer 106 more than a center of the semiconductor wafer 106, a heating element placed above the semiconductor wafer 106 is placed in close proximity to the semiconductor wafer 106. However, at such a placement high temperature cleaning solution from the semiconductor wafer 106 may come into contact with the heating element, causing the heating element to act as a particle source that deposits particles onto a top of the semiconductor wafer 106. By positioning the heating cup 204 around the periphery of the semiconductor wafer 106 the heating cup 204 can be placed further from the semiconductor wafer 106, preventing the heating cup 204 from acting as a particle source. Alternatively, positioning a heating element below the semiconductor wafer 106 can interfere with exhaust flow to an exhaust outlet 214 located on a bottom of the cup-shaped housing 202. Positioning the heating cup 204 around the periphery of the semiconductor wafer 106 prevents the heating cup 204 from interfering with exhaust flow.

In some embodiments, the heating cup 204 comprises a heating element 206 surrounded by a non-corrosive material 208 with a high thermal conductivity. The heating element 206 is connected to a power supply 210 (e.g., a current source) that is configured to provide a current $I_h$ to the heating element 206. Upon receiving the current $I_h$ from the power supply 210, the heating element 206 is configured to generate heat. In various embodiments, the heating element 206 may comprise a highly resistive material such as nickel or chromium. In various embodiments, the non-corrosive material 208 may comprise a quartz material or a teflon coating.

Figure 2B:
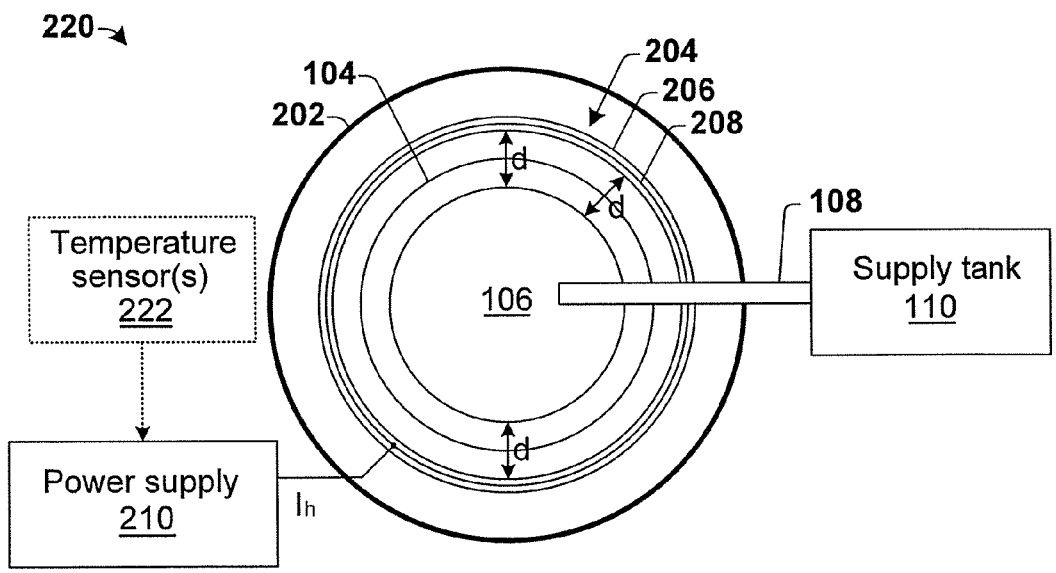
FIG. 2B illustrates a block diagram showing a top-view of a disclosed single wafer cleaning tool having a heating cup.

FIG. 2B illustrates a top-view 220 of some embodiments of a disclosed single wafer cleaning tool 200 having a heating cup 204.

As illustrated in top-view 220, the heating cup 204 is positioned around the perimeter of the semiconductor wafer 106 at a location between the semiconductor wafer 106 and the cup shaped housing 202. In some embodiments, the heating cup 204 is separated from the semiconductor wafer 106 by a substantially equal distance d along the perimeter of the semiconductor wafer 106. For example, as shown in top-view 220, the heating cup 204 is separated from the semiconductor wafer 106 by a substantially equal distance d at any angle around the perimeter of the semiconductor wafer 106. By placing the heating cup 204 at an even distance from the semiconductor wafer 106 at any angle, the heating cup 204 is able to evenly heat to the outer edges of the semiconductor wafer 106.

In various embodiments, the heating cup 204 may comprise a variety of shapes. For example, in some embodiments, the heating cup 204 may comprise a circular shape that extends around the perimeter of the semiconductor. In other embodiments, the heating cup 204 may comprise an alternative shape that extends around the perimeter of the semiconductor wafer 106. For example, in various embodiments, the heating cup 204 may comprise a plurality of heating plates formed into a multi-sided shape (e.g., a hexagonal shape, an oxagonal shape, a decagonal shape, etc.)

It will be appreciated that the temperature of the semiconductor wafer 106 can be varied based upon a value of the current $I_h$ provided to the heating element 206. For example, the larger the current $I_h$ provided by the power supply 210, the more heat produced by the heating element 206. In some embodiments, the single wafer cleaning tool 200 may comprise one or more sensors 222 configured to detect one or more temperature(s) within the cup shaped housing 202 and to provide the sensed temperature(s) to the power supply 210. In such an embodiment, the power supply 210 may be operated to provide a current having a value that heats outer edges of the semiconductor wafer 106 without substantially raising the temperature of a center of the semiconductor wafer 106.

It will be appreciated that the dispensing arm 108 may provide a high temperature cleaning solution 112 having a wide range of chemicals to semiconductor wafer 106. In various embodiments, the dispensing arm 108 is configured to provide a high temperature cleaning solution 112 comprising one or more of: a mixture of ammonium hydroxide, hydrogen peroxide, and water ($NH_4OH/H_2O_2/H_2O$, $NH_4OH/H_2O$); an HPM solution ($HCl/H_2O_2/H_2O$); a mixture of hydrochloric acid and water ($HCl/H_2O$); a piranha solution ($H_2SO_4/H_2O_2$); a mixture of nitric acid and water ($HNO_3/H_2O$); a mixture of nitric acid, hydrochloric acid, and water ($HNO_3/HCl/H_2O$); tetramethylammonium hydroxide (TMAH); a mixture of phosphoric acid and water ($H_3PO_4/H_2O$); a mixture of hydrofluoric acid, nitric acid, and propionic acid ($HF/HNO_3/C_2H_5COOH$); a mixture of hydrofluoric acid, phosphoric acid, and propionic acid ($HF/H_3PO_4/C_2H_5COOH$); an organic solvent (ACT690).

Figure 3:
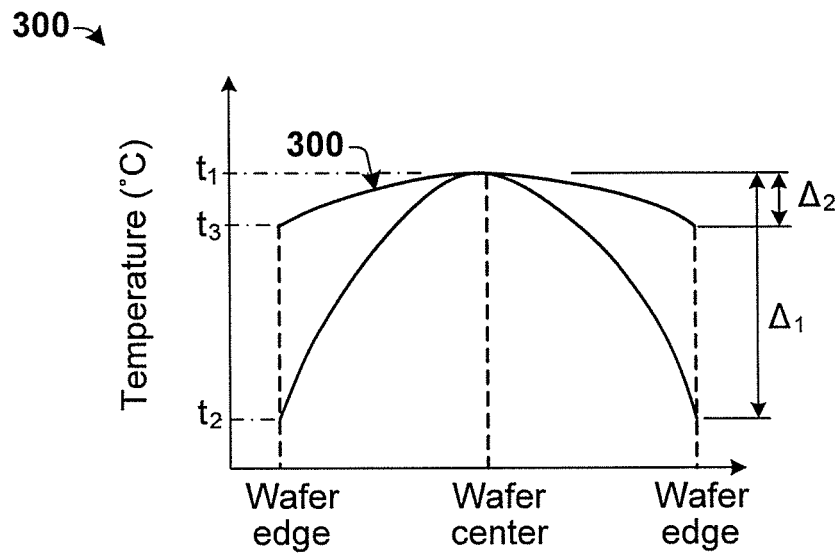
FIG. 3 is a graph showing a comparison of a wafer temperature profile with and without the disclosed heating cup.

FIG. 3 is a graph 300 showing a comparison of an internal temperature profile of a semiconductor wafer within a wafer cleaning tool with and without the disclosed heating cup. Graph 300 illustrates an internal temperature of a semiconductor wafer (y-axis) as a function of position on the semiconductor wafer (x-axis). It will be appreciated that although trend lines 302 and 304 are illustrated as having an internal temperature with a value of $t_1$ at a center of the wafer, in some embodiments the internal temperature of trend line 304 may be higher at a center of the semiconductor wafer than the internal temperature of trend line 302.

Trend line 302 shows the internal temperature profile of a semiconductor wafer without a disclosed heating cup (e.g., without heating cup 204). As shown by trend line 302, the center of the wafer is held at an internal temperature of $t_1$, while edges of the wafer are held at an internal temperature of $t_2$, resulting in an internal temperature difference between edges of the semiconductor wafer and a center of the semiconductor wafer that is equal to $\Delta_1 = t_1 - t_2$.

Trend line 304 shows the internal temperature profile of a semiconductor wafer with a disclosed heating cup. Since the heating cup is located around the periphery of the semiconductor wafer, the heating cup is disproportionally raises the internal temperature of the semiconductor wafer along outside edges of the semiconductor wafer (i.e., raises the internal temperature at the outer edges by more degrees than it raises the internal temperature at a center of the semiconductor wafer). Disproportionally raising the temperature of the outside edges of the semiconductor wafer increases the uniformity of the internal temperature profile of the semiconductor wafer.

Accordingly, as shown by trend line 304, the center of the semiconductor wafer is held at an internal temperature of $t_1$, while outer edges of the semiconductor wafer are held at an internal temperature of $t_3$. The resulting temperature difference between edges of the semiconductor wafer and a center of the semiconductor wafer is equal to $\Delta_2 = t_1 - t_3$, which is less than $\Delta_1$, thereby illustrating that the heating cup homogenizes the internal temperature profile of the semiconductor wafer.

Figure 4:
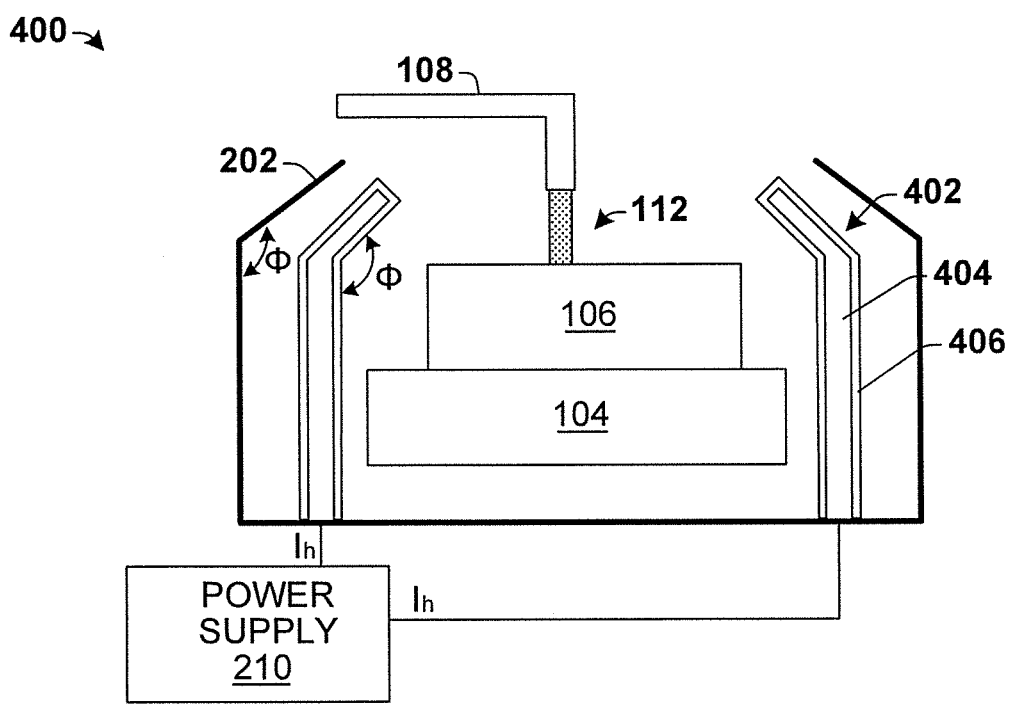
FIG. 4 illustrates some more detailed embodiments of a disclosed single wafer cleaning tool having a heating cup.

FIG. 4 illustrates some alternative embodiments of a disclosed single wafer cleaning tool 400 having a solid heating cup 402.

The single wafer cleaning tool 400 comprises a solid heating cup 402 having a solid cross section. The solid heating cup 402 comprises a resistive core 404 connected to a power supply 210. The resistive core 404 is configured to output heat (e.g., thermal radiation) upon receiving a current $l_h$ from the power supply 210. A coating material 406, having a high thermal conductivity and a high corrosion resistance (e.g., quartz, Teflon, etc.), is coated onto the resistive core 404, to form a solid cross section.

In some embodiment, the disclosed heating cup may have a shape that is conformal to the cup-shaped housing. For example, in some embodiments, the solid heating cup 402 and the cup-shaped housing 202 have a concave curvature at the top opening of the structure. The concave curvature causes the solid heating cup 402 to form an angle $\phi \leq 90°$ with vertical sidewalls of the solid heating cup 402.

Figure 5:
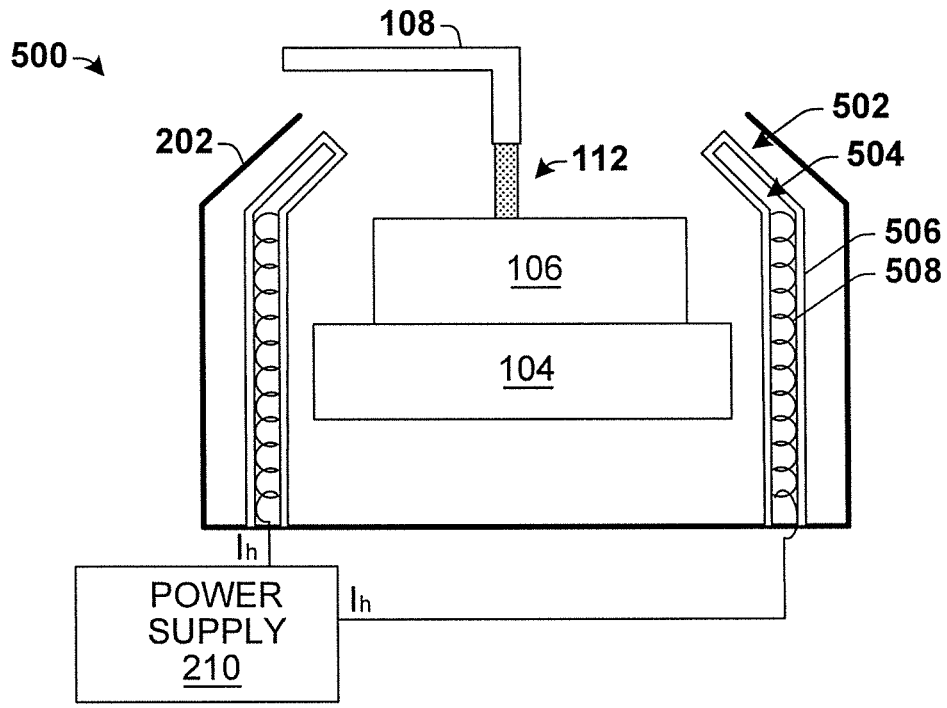
FIG. 5 illustrates some alternative embodiments of a disclosed single wafer cleaning tool having a heating cup.

FIG. 5 illustrates some more detailed embodiments of a disclosed single wafer cleaning tool 500 having a hollow heating cup 502.

The single wafer cleaning tool 500 comprises a hollow heating cup 502 having a cavity 504 that extends along a length of the hollow heating cup 502. For example, the hollow heating cup 502 comprises an outer shell 506 comprising a material having a high thermal conductivity and a high corrosion resistance (e.g., quartz, Teflon, etc.). A heating element 508 is located within the cavity 504. The heating element 508 extends vertically along at least a part of the cavity 504 that is laterally aligned with the semiconductor wafer 106. The heating element 508 is connected to a power supply 210 that is configured to selectively provide a current $l_h$ to the heating element 508. The heating element 508 dissipates the current $l_h$ as heat, which is radiated outward from the heating element 508 as thermal radiation.

In some embodiments, the heating element 508 comprises a heating coil comprising a plurality of loops wrapped around a perimeter of the semiconductor wafer 106. In some embodiments, the heating coil may comprise a high resistive metal such as nickel or chromium, for example.

Figure 6:
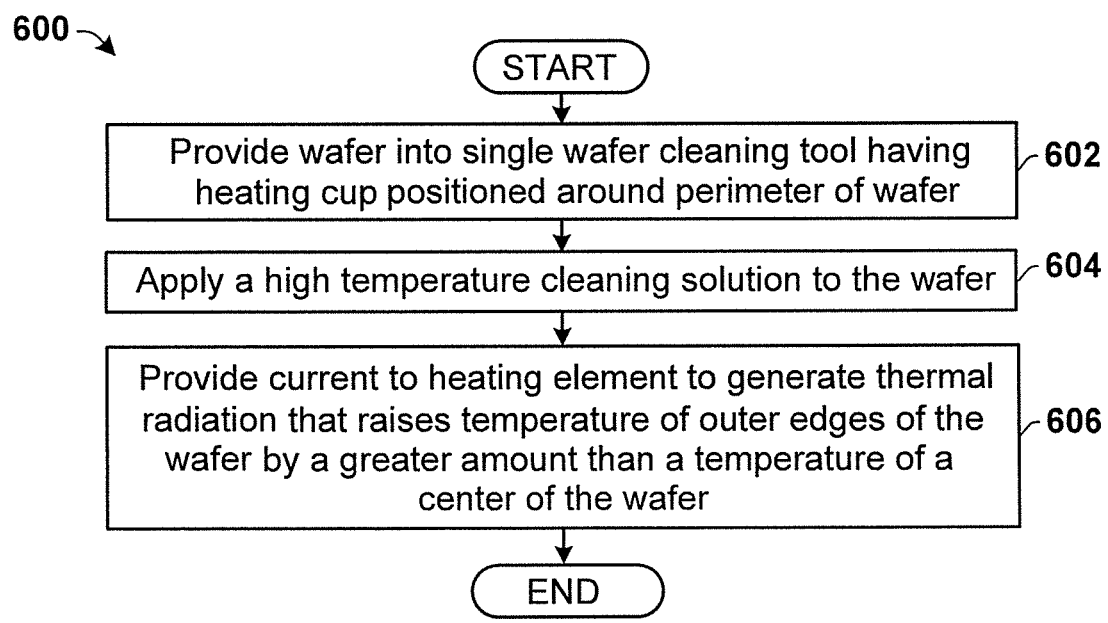
FIG. 6 is a flow diagram illustrating some embodiments of a disclosed method of performing a single wafer cleaning.

FIG. 6 is a flow diagram illustrating some embodiments of a disclosed method 600 of improving the homogeneity of an internal wafer temperature profile during wafer cleaning.

It will be appreciated that while the disclosed method 600 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At act 602, a semiconductor wafer is provided to a single wafer cleaning tool having a heating cup positioned around a perimeter of a wafer. In some embodiments, the heating cup is open at a top of the cup-shaped housing to prevent the heating cup from extending to a position over the semiconductor wafer. In some embodiment, the heating cup is also open at a bottom of the housing cup to prevent the heating cup from extending to a position below the semiconductor wafer.

At act 604, a high temperature cleaning solution is applied to the semiconductor wafer. The high temperature cleaning solution (e.g., having a temperature of greater than 60° C.) heats the center of the semiconductor wafer by a greater amount than outer edges of the semiconductor wafer, resulting in an uneven temperature profile over the semiconductor wafer.

At act 606, a heating cup is operated to generate heat that raises the temperature of outer edges of the semiconductor wafer by a greater amount than a temperature of a center of the semiconductor wafer. By raising the temperature of the outer edges of the semiconductor wafer by a greater amount than a temperature of a center of the semiconductor wafer a uniform internal temperature profile of the semiconductor wafer can be generated. In some embodiments, the heating cup is operated to generate heat by providing a current to the heating cup.

Although the disclosed figures reference a temperature profile of a semiconductor wafer, it will be appreciated that the disclosed wafer cleaning tool is not limited to homogenizing semiconductor wafers. Rather, the disclosed wafer cleaning tool may be used to homogenize any substrate made of a semiconductor material (e.g., Si, Ge, GaAs, etc.) and/or having one or more overlying layers (e.g., an oxide layer, a metal layer, an epitaxial layer, etc.).

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to methods and apparatus for providing a homogeneous internal temperature profile for a semiconductor wafer in a wafer cleaning tool without introducing unwanted particles onto the wafer.

In some embodiments, the present disclosure relates to a wafer cleaning tool, comprising a processing chamber configured to house a semiconductor wafer. The wafer cleaning tool further comprises a dispensing arm configured to provide a high temperature cleaning solution to the semiconductor wafer. The wafer cleaning tool further comprises a heating cup located within the processing chamber at a position that is around a perimeter of the semiconductor wafer and configured to generate heat that increases the temperature of outer edges of the semiconductor wafer by a greater amount than a temperature of a center of the semiconductor wafer, thereby homogenizing an internal temperature profile of the semiconductor wafer.

In another embodiment, the present disclosure relates to a single wafer cleaning tool, comprising a processing chamber having a cup shaped housing configured to house a semiconductor wafer. A dispensing arm is configured to provide a high temperature cleaning solution to the semiconductor wafer. A heating cup is located within the processing chamber at a position that is around the perimeter of the semiconductor wafer. The heating cup has an opening above the semiconductor wafer that prevents the heating cup from extending to a position above the semiconductor wafer. The heating cup is configured to generate heat that increases the temperature of outer edges of the semiconductor wafer by a greater amount than a temperature of a center of the semiconductor wafer, thereby homogenizing an internal temperature profile of the semiconductor wafer.

In another embodiment, the present disclosure relates to a method of improving the homogeneity of an internal wafer temperature profile during wafer cleaning. The method comprises providing a semiconductor wafer into single wafer cleaning tool having heating cup positioned around perimeter of the semiconductor wafer. The method further comprises applying a high temperature cleaning solution to the semiconductor wafer. The method further comprises providing a current to the heating cup, wherein the current causes the heating cup to generate thermal radiation that raises temperature of outer edges of the semiconductor wafer by a greater amount than a temperature of a center of the wafer, resulting in a homogenized temperature provide across the semiconductor wafer.

What is claimed is:

1. A wafer cleaning tool, comprising:
   a processing chamber configured to house a semiconductor wafer;
   a dispensing arm configured to provide a high temperature cleaning liquid onto a center of the semiconductor wafer;
   a heating element configured to increase a temperature of the high temperature cleaning liquid prior to providing it to the dispensing arm; and
   a heating cup located within the processing chamber at a position that is around a perimeter of the semiconductor wafer and configured to radiate heat from multiple areas surrounding the perimeter to increase a temperature of outer edges of the semiconductor wafer by a greater amount than a temperature of the center of the semiconductor wafer.

2. The wafer cleaning tool of claim 1,
   wherein the heating cup extends from an upper position above the semiconductor wafer to a lower position below the semiconductor wafer, and
   wherein the heating cup is open above the semiconductor wafer to prevent the heating cup from extending to a position above the semiconductor wafer.

3. The wafer cleaning tool of claim 2, wherein the heating cup is open below the semiconductor wafer to prevent the heating cup from extending to a position above the semiconductor wafer.

4. The wafer cleaning tool of claim 1, further comprising:
   a power supply electrically connected to the heating cup and configured to provide a current to the heating cup, wherein upon receiving the current the heating cup is configured to generate the heat.

5. The wafer cleaning tool of claim 1, wherein the high temperature cleaning liquid has a temperature of greater than or equal to 60° C.

6. The wafer cleaning tool of claim 1, wherein the heating cup comprises:
   a heating element configured to generate heat; and
   a non-corrosive material having a high thermal conductivity configured to enclose the heating element.

7. The wafer cleaning tool of claim 6, wherein the non-corrosive material comprises quartz or teflon.

8. The wafer cleaning tool of claim 6,
   wherein the heating element comprises a heating coil located within a cavity in the non-corrosive material; and
   wherein the heating coil continuously extends around the perimeter of the semiconductor wafer.

9. The wafer cleaning tool of claim 1, wherein the high temperature cleaning liquid comprises one or more of: a mixture of ammonium hydroxide, hydrogen peroxide, and water ($NH_4OH/H_2O_2/H_2O$, $NH_4OH/H_2O$); an HPM solution ($HCl/H_2O_2/H_2O$); a mixture of hydrochloric acid and water ($HCl/H_2O$); a piranha solution ($H_2SO_4/H_2O_2$); a mixture of nitric acid and water ($HNO_3/H_2O$); a mixture of nitric acid, hydrochloric acid, and water ($HNO_3/HCl/H_2O$); tetramethylammonium hydroxide (TMAH); a mixture of phosphoric acid and water ($H_3PO_4/H_2O$); a mixture of hydrofluoric acid, nitric acid, and propionic acid ($HF/HNO_3/C_2H_5COOH$); a mixture of hydrofluoric acid, phosphoric acid, and propionic acid ($HF/H_3PO_4/C_2H_5COOH$); an organic solvent (ACT690).

10. The wafer cleaning tool of claim 1, wherein the heating cup separated from the semiconductor wafer by a substantially equal distance along the perimeter of the semiconductor wafer.

11. A single wafer cleaning tool, comprising:
    a processing chamber having a cup shaped housing configured to house a semiconductor wafer;
    a dispensing arm configured to provide a high temperature cleaning liquid to the semiconductor wafer; and
    a heating cup located within the processing chamber at a position that is laterally between the semiconductor wafer and the CUP shaped housing and that is around a perimeter of the semiconductor wafer and having an opening above the semiconductor wafer that prevents the heating cup from extending to a position above the semiconductor wafer;
    wherein the heating cup is configured to radiate heat from multiple areas surrounding the perimeter to increase a temperature of outer edges of the semiconductor wafer by a greater amount than a temperature of a center of the semiconductor wafer.

12. The wafer cleaning tool of claim 11, wherein the high temperature cleaning liquid has a temperature of greater than or equal to 60° C.

13. The wafer cleaning tool of claim 11, wherein the heating cup comprises:

a heating element configured to generate heat, which comprises a heating coil extending continuously around the perimeter of the semiconductor wafer; and a non-corrosive material having a high thermal conductivity configured to enclose the heating element.

14. The wafer cleaning tool of claim 13, wherein the non-corrosive material comprises quartz or teflon.

15. The wafer cleaning tool of claim 11, wherein the high temperature cleaning liquid comprises one or more of: a mixture of ammonium hydroxide, hydrogen peroxide, and water ($NH_4OH/H_2O_2/H_2O$, $NH_4OH/H_2O$); an HPM solution ($HCl/H_2O_2/H_2O$); a mixture of hydrochloric acid and water ($HCl/H_2O$); a piranha solution ($H_2SO_4/H_2O_2$); a mixture of nitric acid and water ($HNO_3/H_2O$); a mixture of nitric acid, hydrochloric acid, and water ($HNO_3/HCl/H_2O$); tetramethylammonium hydroxide (TMAH); a mixture of phosphoric acid and water ($H_3PO_4/H_2O$); a mixture of hydrofluoric acid, nitric acid, and propionic acid ($HF/HNO_3/C_2H_5COOH$); a mixture of hydrofluoric acid, phosphoric acid, and propionic acid ($HF/H_3PO_4/C_2H_5COOH$); an organic solvent (ACT690).

16. The wafer cleaning tool of claim 11, wherein the heating cup is concentric with the cup shaped housing.

17. A method of improving a homogeneity of an internal wafer temperature profile during wafer cleaning, comprising:

providing a semiconductor wafer into single wafer cleaning tool having a heating cup positioned around a perimeter of the semiconductor wafer;

applying a high temperature cleaning liquid to a center of the semiconductor wafer; and providing a current to the heating cup, wherein the current causes the heating cup to radiate thermal radiation from multiple areas surrounding the perimeter of the semiconductor wafer, so as to raise temperatures of outer edges of the semiconductor wafer by a greater amount than a temperature of the center of the semiconductor wafer.

18. The method of claim 17, wherein the high temperature cleaning liquid has a temperature of greater than or equal to 60° C.

19. The method of claim 17, wherein the heating cup comprises:

a heating element configured to generate heat, which comprises a heating coil extending continuously around the perimeter of the semiconductor wafer; and a non-corrosive material having a high thermal conductivity configured to enclose the heating element.

20. The method of claim 17, wherein the high temperature cleaning liquid comprises one or more of: a mixture of ammonium hydroxide, hydrogen peroxide, and water ($NH_4OH/H_2O_2/H_2O$, $NH_4OH/H_2O$); an HPM solution ($HCl/H_2O_2/H_2O$); a mixture of hydrochloric acid and water ($HCl/H_2O$); a piranha solution ($H_2SO_4/H_2O_2$); a mixture of nitric acid and water ($HNO_3/H_2O$); a mixture of nitric acid, hydrochloric acid, and water ($HNO_3/HCl/H_2O$); tetramethylammonium hydroxide (TMAH);

a mixture of phosphoric acid and water ($H_3PO_4/H_2O$); a mixture of hydrofluoric acid, nitric acid, and propionic acid ($HF/HNO_3/C_2H_5COOH$); a mixture of hydrofluoric acid, phosphoric acid, and propionic acid ($HF/H_3PO_4/C_2H_5COOH$); an organic solvent (ACT690).

* * * * *